US012647097B2

(12) United States Patent
Inoue

(10) Patent No.: US 12,647,097 B2
(45) Date of Patent: Jun. 2, 2026

(54) ACOUSTIC WAVE DEVICE WITH MULTI-PERIOD ARCCOSINE APODIZATION

(71) Applicant: Qorvo US, Inc., Greensboro, NC (US)

(72) Inventor: Shogo Inoue, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 141 days.

(21) Appl. No.: 18/597,588

(22) Filed: Mar. 6, 2024

(65) Prior Publication Data

US 2024/0313739 A1    Sep. 19, 2024

Related U.S. Application Data

(60) Provisional application No. 63/585,653, filed on Sep. 27, 2023, provisional application No. 63/490,483, filed on Mar. 15, 2023.

(51) Int. Cl.
*H03H 9/145* (2006.01)
*H03H 9/02* (2006.01)
*H03H 9/64* (2006.01)

(52) U.S. Cl.
CPC ...... *H03H 9/1452* (2013.01); *H03H 9/02992* (2013.01); *H03H 9/64* (2013.01)

(58) Field of Classification Search
CPC .... H03H 9/1452; H03H 9/02992; H03H 9/64; H03H 9/02858; H03H 9/02881; H03H 9/1457

USPC ................................................... 333/193–196
See application file for complete search history.

(56) References Cited

U.S. PATENT DOCUMENTS

| | | | |
|---|---|---|---|
| 6,774,536 B2 | 8/2004 | Kachi et al. | |
| 8,723,620 B2 | 5/2014 | Nishimura et al. | |
| 9,641,152 B2 | 5/2017 | Nakamura et al. | |
| 10,425,060 B2 | 9/2019 | Nakamura et al. | |
| 2020/0106418 A1* | 4/2020 | Inoue | H03H 9/13 |

* cited by examiner

*Primary Examiner* — Jorge L Salazar, Jr.
(74) *Attorney, Agent, or Firm* — Fish & Richardson P.C.

(57) ABSTRACT

An acoustic wave device includes a piezoelectric layer and an interdigital electrode structure over the piezoelectric layer. The interdigital electrode structure includes a plurality of first electrode fingers extending from a first busbar towards a first apodization edge, and a plurality of second electrode fingers extending from a second busbar towards a second apodization edge. The plurality of first electrode fingers and the plurality of second electrode fingers are interleaved with one another. At least one of the first apodization edge or the second apodization edge follows a periodic arccosine apodization function over at least two adjacent electrode fingers. A number of periods of the first apodization edge or the second apodization edge is at least 2. A first distance between one of a first electrode finger or a second electrode finger and the respective periodic arccosine apodization function is less than or equal to a predetermined percentage of an apodization amplitude.

20 Claims, 17 Drawing Sheets

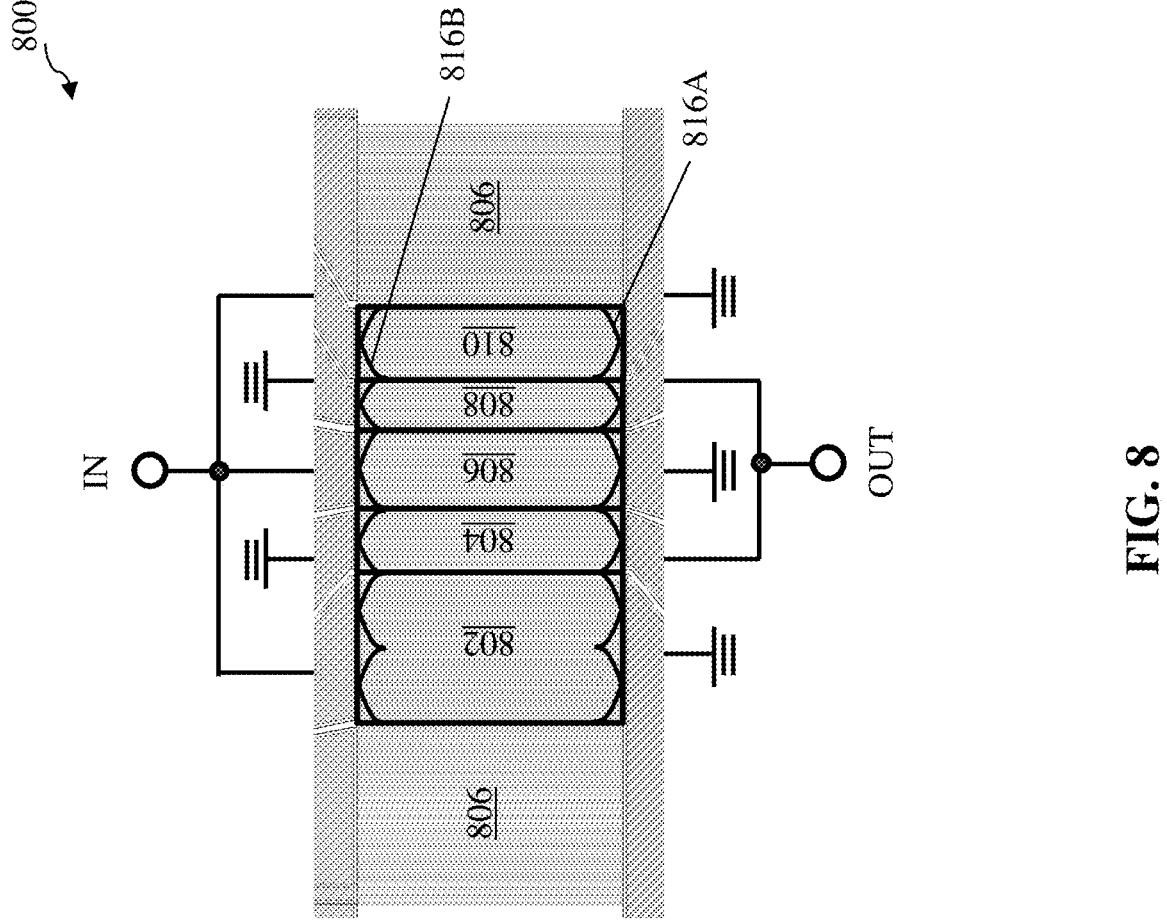
FIG. 8
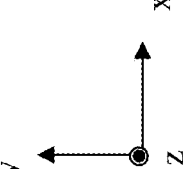

ACOUSTIC WAVE DEVICE WITH MULTI-PERIOD ARCCOSINE APODIZATION

RELATED APPLICATIONS

This application claims priority to U.S. Provisional Patent Application No. 63/490,483 filed Mar. 15, 2023 and U.S. Provisional Patent Application No. 63/585,653 filed Sep. 27, 2023, all of which are incorporated herein by reference in their entireties.

FIELD OF THE DISCLOSURE

The present disclosure relates to surface acoustic wave resonators, in particular, to an acoustic wave device with multi-period arccosine apodization.

BACKGROUND

Acoustic wave devices are widely used in modern electronics. At a high level, an acoustic wave device often includes a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of radio frequency (RF) signals for communication. Due to the stringent demands placed on filters for modern RF communications systems, acoustic wave devices for these applications must provide high quality factor, wide bandwidth (i.e., high electromechanical coupling coefficient), and be small in size. Often, undesired oscillations or vibrations are transduced in the piezoelectric material of an acoustic wave device which degrade the performance thereof. These undesired oscillations or vibrations are often referred to as spurious modes or transverse modes.

SUMMARY

Embodiments of the disclosure provide an acoustic wave device. The acoustic wave device includes a piezoelectric layer, and an interdigital electrode structure over the piezoelectric layer. The interdigital electrode structure includes, in a width direction, a plurality of first electrode fingers extending from a first busbar towards a first apodization edge, and a plurality of second electrode fingers extending from a second busbar towards a second apodization edge. The plurality of first electrode fingers and the plurality of second electrode fingers are interleaved with one another along a length direction, the length direction being different from the width direction. At least one of the first apodization edge or the second apodization edge follows a periodic arccosine apodization function over at least two adjacent electrode fingers of the plurality of first electrode fingers or the plurality of second electrode fingers. A number of periods of the at least one of the first apodization edge or the second apodization edge is at least 2. A first distance between one of a first electrode finger or a second electrode finger and the respective periodic arccosine apodization function is less than or equal to a predetermined percentage of an apodization amplitude of the periodic arccosine apodization function. In some embodiments, at least one of the first apodization edge or the second apodization edge of 10%, 20%, 30%, 40%, 50%, 60%, 70%, 80%, 90%, 95% or 100% of electrode fingers of the plurality of first electrode fingers or the plurality of second electrode fingers follows an apodization function. A first distance between one of the first electrode finger or the second electrode finger (e.g., whose apodization edge follows the respective periodic arccosine apodization function) and the respective periodic arccosine apodization function is less than or equal to a predetermined percentage of an apodization amplitude of the periodic arccosine apodization function. In various embodiments, the predetermined percentage is equal to 10%, 20%, or 30%.

In some embodiments, the interdigital electrode structure further includes a plurality of first dummy electrodes extending from the second busbar and a plurality of second dummy electrodes extending from the first busbar. The plurality of first dummy electrodes are each aligned with a respective first electrode finger in the width direction and separated from the respective first electrode finger by a first gap, the plurality of second dummy electrodes are each aligned with a respective second electrode finger in the width direction and separated from the respective second electrode finger by a second gap.

In some embodiments, a second distance between one of a first dummy electrode or a second dummy electrode and the respective periodic arccosine apodization function is less than or equal to a second predetermined percentage of the apodization amplitude of the periodic arccosine apodization function.

In some embodiments, the first percentage and the second percentage are each equal to or less than about 30%.

In some embodiments, in one period, a normalized value of the periodic arccosine apodization function at a position in the length direction is partially determined by a position value, the position value being between about −0.5 and about 1.

In some embodiments, in the one period, the normalized value of the arccosine apodization function at the position is further partially determined by a power coefficient associated with the position value, the power coefficient being between about 0.5 and 1.5.

In some embodiments, the number of periods of the at least one of the first apodization edge or the second apodization edge is between about 3 per 100λ and about 50 per 100λ, λ being a wavelength of an acoustic wave propagating in the interdigital electrode structure.

In some embodiments, in one period, a minimum overlap between adjacent first electrode finger and second electrode finger is greater than zero.

In some embodiments, in one period, the minimum overlap between adjacent first electrode finger and second electrode finger is equal to or greater than a percentage of a maximum overlap between adjacent first electrode finger and second electrode finger.

In some embodiments, the percentage is about 5%.

In some embodiments, the apodization amplitude is greater than or equal to about λ and less than or equal to about 8λ, λ being a wavelength of an acoustic wave propagating in the interdigital electrode structure.

In some embodiments, the at least one of the first apodization edge or the second apodization edge includes a first period and a second period in the length direction, the first and second periods being the same or different.

In some embodiments, a minimum length of at least one of the plurality of first dummy electrodes or the plurality of second dummy electrodes is between 0 and about 5λ, λ being a wavelength of an acoustic wave propagating in the interdigital electrode structure.

In some embodiments, one of the plurality of first dummy electrodes is swapped with another one of the plurality of first dummy electrodes, and a first electrode finger aligned with the one of the plurality of first dummy electrodes is swapped with another first electrode finger aligned with the other one of the plurality of first dummy electrodes; or one of the plurality of second dummy electrodes is swapped with another one of the plurality of second dummy electrodes, and a second electrode finger aligned with the one of the plurality of second dummy electrodes is swapped with another second electrode finger aligned with the other one of the plurality of second dummy electrodes.

In some embodiments, the acoustic wave device further includes a substrate bonded with the piezoelectric layer, wherein a thickness of the piezoelectric layer is less than or equal to 5λ, λ being a wavelength of an acoustic wave transmitted in the interdigital electrode structure.

In some embodiments, the piezoelectric layer includes lithium tantalate (LiTaO) or lithium niobate (LiNbO); and the substrate includes at least one of silicon, sapphire, quartz, silicon carbide, spinel, ceramics, an insulating material, or a semiconductor material.

In some embodiments, the acoustic wave device further includes an intermediate layer between the piezoelectric layer and the substrate, the intermediate layer including a dielectric material, a metallic material, an insulating material, or a semiconductor material. An example of the intermediate layer includes silicon oxide (SiO) or tantalum oxide ($Ta_xO_y$), such as $SiO_2$ and/or $Ta_2O_5$.

In some embodiments, a first dummy electrode and an adjacent second electrode finger are joined by a metal film; or a second dummy electrode and an adjacent first electrode finger are joined by another metal film.

In some embodiments, the first apodization edge and the second apodization edge have a same apodization amplitude or different apodization amplitudes.

In some embodiments, in one period, a minimum overlap between adjacent first electrode finger and second electrode finger is approximately zero.

In some embodiments, the at least one of the first apodization edge or the second apodization edge follows a periodic arccosine apodization function exactly over one of the at least two adjacent electrode fingers; and a distance between another one of the at least two adjacent electrode fingers and the respective periodic arccosine apodization function is less than or equal to the predetermined percentage of the apodization amplitude.

Embodiments of the present disclosure provide a coupled resonator filter. The coupled resonator filter includes a plurality of acoustic resonators arranged in a length direction. Each of the acoustic resonators includes a piezoelectric layer, and a plurality of interdigital electrode structures over the piezoelectric layer. Each of the plurality of interdigital electrode structures includes: in a width direction, a plurality of first electrode fingers extending from a first busbar towards a first apodization edge, and a plurality of second electrode fingers extending from a second busbar towards a second apodization edge. The plurality of first electrode fingers and the plurality of second electrode fingers are interleaved with one another along a length direction, the length direction being different from the width direction. At least one of the first apodization edge or the second apodization edge follows a periodic arccosine apodization function over at least two adjacent electrode fingers of the plurality of first electrode fingers or the plurality of second electrode fingers, a number of periods of the at least one of the first apodization edge or the second apodization edge being at least 2. A first distance between one of a first electrode finger or a second electrode finger and the respective periodic arccosine apodization function is less than or equal to a predetermined percentage of an apodization amplitude of the periodic arccosine apodization function.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

FIGS. 1A and 1B each illustrates an exemplary acoustic wave device with multi-period arccosine apodization, according to some aspects of the present disclosure.

FIG. 8 illustrate a coupled resonator filter employing a plurality of acoustic wave devices with multi-period arccosine apodization, according to some aspects of the present disclosure.

DETAILED DESCRIPTION

Figure 1A:
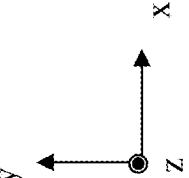
FIGS. 1C and 1D illustrate performances of an exemplary acoustic wave device with multi-period arccosine apodization, according to some aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As used herein, the term "layer" refers to a piece of a material. The term "layer" may encompass a wide range of thicknesses ranging from a few nanometers to several centimeters. For example, a layer may refer to a thin film of several nanometers to a few microns, or a substrate/wafer of a few hundred microns. The specific meaning of the term "layer" should be interpreted broadly based on the context, e.g., the Specification and the Claims, and should not be limited by the embodiments of the present disclosure.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. Additionally, like reference numerals denote like features throughout specification and drawings.

An existing SAW resonator may have unwanted transverse modes and spurious modes which can hinder a practical use of the SAW resonator as a sole resonator or as a component of a filter. Effort has been made to suppress the transverse modes in an SAW resonator. For example, the transverse modes can be suppressed by a single-period arccosine apodization $$\left( y = \pm \frac{\arccos|x|}{\arccos(0)}, -1 \leq x \leq 1 \right),$$

but this apodization may degrade the quality factor Q (e.g., especially below resonance frequency) and electromechanical coupling coefficient $k^2$ of the SAW resonator. The single-period arccosine apodization also requires an increase of the size of the SAW resonator such that the SAW resonator can maintain the same capacitance (e.g., total overlapping areas between adjacent electrode fingers).

Embodiments of the present disclosure provide an acoustic wave device with multi-period arccosine apodizations. The proposed acoustic wave device may include an interdigital electrode structure that is apodized with multi-period arccosine apodization which includes one or more apodization edges that each extends in an arccosine curve in a length direction as a function of position values. The number of periods in each apodization edge may be at least 2. The electrode fingers of the interdigital electrode structure may interleave in the length direction and may respectively extend to the apodization edges. The arccosine curves can be flexibly designed based on a modified arccosine equation that takes into account of the position values and the power coefficient of the position value. In various embodiments, an arccosine curve can have a different amplitude, a different shape, and/or a different period length by varying certain parameters in the modified arccosine equation. For example, an arccosine curve can have different amplitudes in different acoustic wave devices or in the same acoustic wave device, or have different period lengths in different acoustic wave devices or in the same acoustic wave device. The arccosine curve can extend in the entire interdigital electrode structure or extend in part of the interdigital electrode structure, while the other part of the interdigital electrode structure without the arccosine curve can be left without apodization or can be apodized by a non-arccosine apodization (e.g., sinusoid apodization).

In some embodiments, the minimum overlap between the adjacent electrode fingers of the multi-period arccosine apodization can be greater than zero to increase the overall overlapping areas between adjacent electrode fingers such that the capacitance of the acoustic wave device can be increased. In some embodiments, the number of periods of the multi-period arccosine apodization may be at least 3 (or 4, 5, 6, 7, 8) per 100λ, λ being the wavelength of the acoustic wave. In some embodiments, the number of periods may be between about 3 and about 50 per 100λ. The proposed multi-period arccosine apodization may result in higher Q, greater $k^2$, and smaller sized acoustic wave device, than the single-period arccosine apodization, while maintaining desirably high suppression of the transverse modes. In some embodiments, an acoustic wave device with the multi-period arccosine apodization can be applied in other structures such as a bonded wafer structure and/or a coupled resonator filter (CRF). For example, an acoustic wave device with the multi-period arccosine apodization can be used in a bonded wafer structure when transverse modes are present (e.g., the thickness of the piezoelectric layer is less than 5λ to suppress transverse modes, λ being the wavelength of the acoustic wave propagating in the interdigital electrode structure). In another example, a plurality of acoustic wave devices each with the multi-period arccosine apodization can be arranged in a CRF to suppress transverse modes.

FIG. 1A illustrates an exemplary acoustic wave device 100 (e.g., a SAW resonator) according to embodiments of the present disclosure. Acoustic wave device 100 may include a piezoelectric layer 132, a pair of reflectors 126 over piezoelectric layer 132, and an interdigital electrode structure 102 positioned between reflectors 126. As shown in FIG. 1A, each reflector 126 may include a pair of reflector busbars 106 each extending in the x-direction (e.g., the length direction) and a plurality of reflector bars 108 extending between the pair of reflector busbars 106 in the y-direction (e.g., the width direction).

Interdigital electrode structure 102 may be aligned with reflectors 126 in the y-direction. Interdigital electrode structure 102 may include a first busbar 104A and a second busbar 104B each extending in the x-direction. Interdigital electrode structure 102 may include a plurality of first electrode fingers 110A extending from first busbar 104A in the y-direction, and a plurality of second electrode fingers 110B extending from second busbar 104B in the y-direction. An acoustic wave, having a wavelength of λ, may propagate in the first and second electrode fingers 110A and 110B along the x-direction. The plurality of first electrode fingers 110A may each extend to a first apodization edge 116A, and the plurality of second electrode fingers 110B may each extend to a second apodization edge 116B. In some embodiments, the distance between the centers of adjacent first electrode fingers 110A (e.g., in the x-direction) may be λ, and the distance between the centers of adjacent second electrode fingers 110B (e.g., in the x-direction) may be A.

A first electrode finger 110A may overlap with at least one adjacent second electrode finger 110B (e.g., or both adjacent second electrode fingers 110B) in the y-direction, and a second electrode finger 110B may overlap with at least one adjacent first electrode finger 110A (e.g., or both adjacent first electrode fingers 110A) in the y-direction. The minimum overlap 130 between a first electrode finger 110A and an adjacent electrode finger 110B may be referred to as an "opening," and may have a dimension (e.g., in the y-direction) of $L_{omin}$. In some embodiments, the maximum overlap between a first electrode finger 110A and a second electrode finger 110B is normalized to be 1, and $L_{omin}$ is a ratio (e.g., normalized value) between the actual dimensions of the minimum overlap and the actual dimension of the maximum overlap between a first electrode finger 110A and a second electrode finger 110B (e.g., element 150 described below). For example, $L_{omin}$ is a fraction between 0 and 1.

The total overlapping area between first electrode fingers 110A and second electrode fingers 110B may increase with a greater $L_{omin}$. That is, the active area ratio (e.g., the ratio of the total overlapping area to the total area of the electrode fingers) may increase. Accordingly, at a fixed size, the capacitance of the acoustic wave device may increase. The size of the acoustic wave device may thus be decreased for the same capacitance. In some embodiments, increasing the value of $L_{omin}$ may improve the electromechanical coupling coefficient $k^2$ of the acoustic wave device. FIG. 1D illustrates values of $k^2$ at different $L_{omin}$ values. It can be shown that the value of $k^2$ increases with greater $L_{omin}$.

First apodization edge 116A and/or second apodization edge 116B may, across adjacent overlapping electrode fingers, and are provided as part of a periodic arccosine curve/pattern having a period P of at least 2 in the x-direction. First apodization edge 116A and second apodization edge 116B may be employed to confine the lengths of electrode fingers and dummy electrodes, and thus define the apodization parameters of interdigital electrode structure 102. For example, first apodization edge 116A and second apodization edge 116B may extend in periods with an amplitude to cause the lengths of the electrode fingers and dummy electrodes to vary accordingly and periodically. A period P of an apodization edge (e.g., 116A and/or 116B), e.g., a full period, may be part of an arccosine curve starting at a horizontal axis (parallel to the x-direction) and having both a peak about the horizontal axis and a trough below the horizontal axis. In this disclosure, any apodization edge/curve, computed based on arccos(x) and meeting this criteria, can be used without departing from the principles of this disclosure. In period P, first apodization edge 116A and/or second apodization edge 116B may each have an amplitude 144 that is the distance between the highest peak and the lowest valley of the respective apodization edge, and can be denoted as Am. In some embodiments, in period P, the lowest valley 120A of first apodization edge 116A and the lowest valley 120B of second apodization edge 116B aligned with each other in the y-direction, and minimum overlap 130 is formed by a first electrode finger 110A and an adjacent second electrode finger 110B located between the lowest valleys 120A and 120B. In some embodiments, as shown in FIG. 1A, minimum overlap 130 (or the opening) may be greater than zero such that there is desirable overlap between a first electrode finger 110A and an adjacent second electrode finger 110B in acoustic wave device 100.

The maximum overlap between a first electrode finger 110A and a second electrode finger 110B may be referred to as element 150, and may have a dimension (e.g., length in the y-direction) of $L_{omax}$. In some embodiments, when first apodization edge 116A and second apodization edge 116B are symmetric about middle line 140, maximum overlap 150 may be positioned between the peaks of first apodization edge 116A and second apodization edge 116B (e.g., at half period ½P). The amplitude Am of first apodization edge 116A (or second apodization edge 116B) may be calculated as $Am = L_{omax}/2 \times (1 - L_{omin})$. In some embodiments, the value of Am may be greater than λ and equal to or less than 8λ. For example, the value of Am may be equal to or less than 7λ, equal to or less than 6λ. In some embodiments, $L_{omin}$ is greater than 5% of $L_{omax}$. In some embodiments, $L_{omin}$ is greater than 10% of $L_{omax}$. In some other embodiments, $L_{omin}$ is greater than 15% of $L_{omax}$.

In some embodiments, first apodization edge 116A and second apodization edge 116B form a multi-period arccosine curve having a period P of at least 2 in the x-direction, and may be symmetric about a middle line 140 that extends in the x-direction and positioned at a middle position between first and second busbars 104A and 104B.

Interdigital electrode structure 102 may also include a plurality of first dummy electrodes 118A extending from second busbar 104B in the y-direction, and a plurality of second dummy electrodes 118B extending from first busbar 104A in the y-direction. A first dummy electrode 118A may be positioned between two adjacent second electrode fingers 110B, and a second dummy electrode 118B may be positioned between two adjacent first electrode fingers 110A. A first dummy electrode 118A may be aligned with a respective first electrode finger 110A in the y-direction, and a second dummy electrode 118B may be aligned with a respective second electrode finger 110B in the y-direction. A dummy electrode (e.g., dummy electrode 118A or 118B) may not have any overlap with an electrode finger from the different busbar. As shown in FIG. 1A, a gap 146A between a first dummy electrode 118A and the respective first electrode finger 110A (or first edge apodization 116A) may have a dimension D1 that is greater than zero, and a gap 146B between a second dummy electrode 118B and the respective second electrode finger 110B (or second edge apodization 116B) may have a dimension D2 that is greater than zero. In some embodiments, a length L1 of a first dummy electrode 118A, in the y-direction, can be zero or non-zero, and a length L2 of a second dummy electrode 118B, in the y-direction, can be zero or non-zero. In some embodiments, L1 and L2 may each be less than 2λ, less than λ, less than 0.5λ, less than 0.25λ, or 0. In some embodiments, a smaller L1 and/L2 may result in higher Q factor, higher electromechanical coupling coefficient k², and improved transverse mode suppression. In some embodiments, a minimum value of L1 and L2 are each less than 5λ.

Figure 1B:
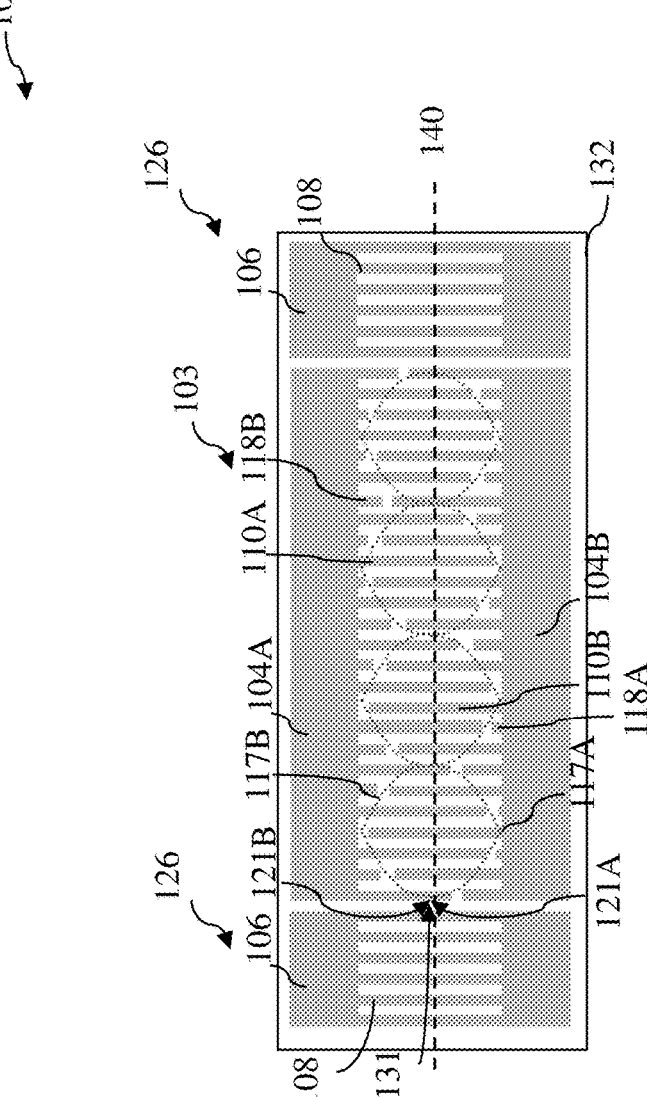
Figure 1B:
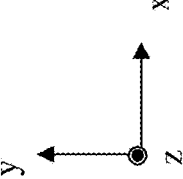

FIG. 1B illustrates an exemplary acoustic wave device 100 (e.g., a SAW resonator) according to embodiments of the present disclosure. Different from acoustic wave device 101, interdigital electrode structure 103 may be apodized with a first apodization edge 117A and a second apodization edge 117B, each having a plurality of periods of an arccosine curve in the x-direction. A minimum overlap 131 between a first electrode finger 110A and an adjacent second electrode finger 110B at the lowest valleys 121A and 121B may be approximately zero.

Figure 1C:
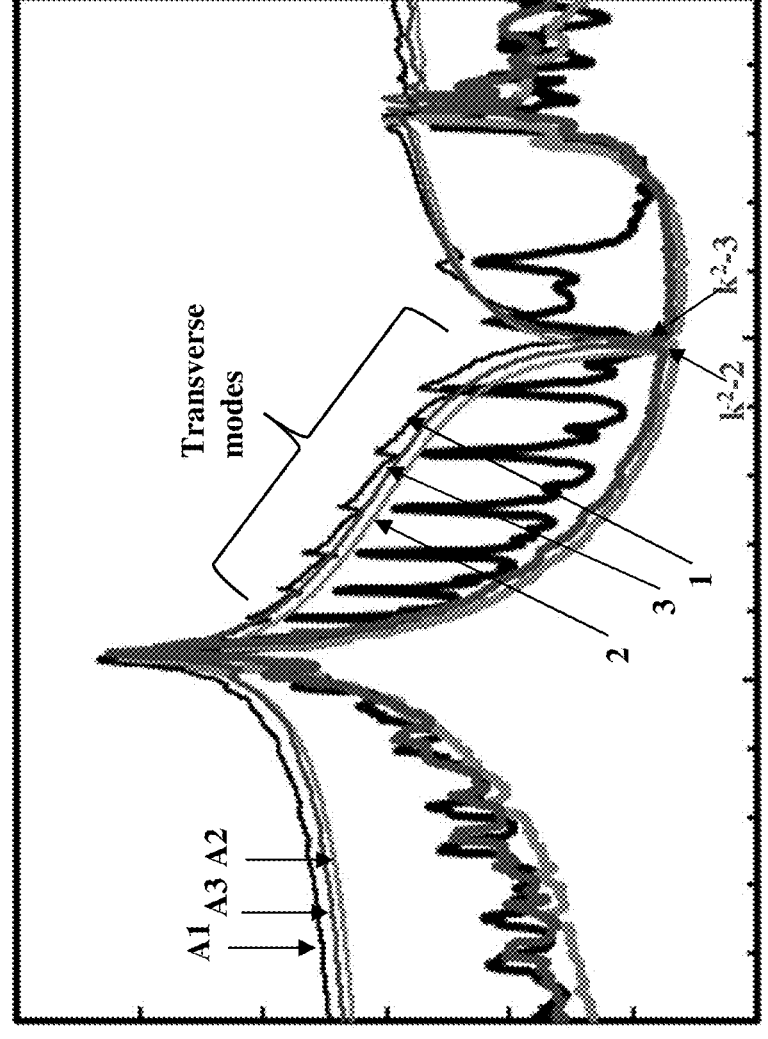
Figure 1D:
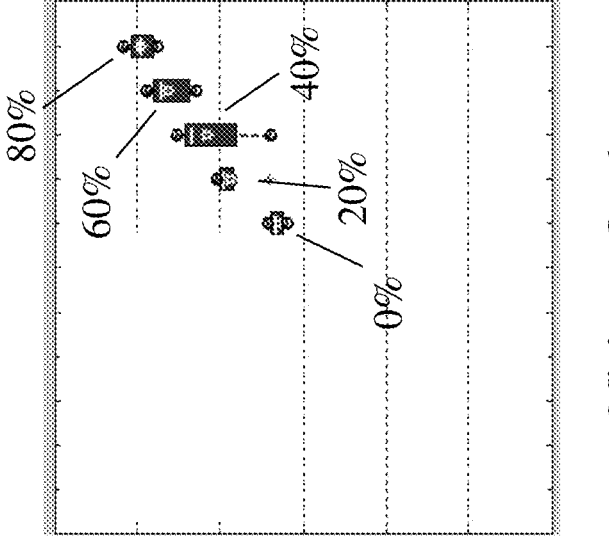

FIG. 1C illustrates the performance of an acoustic wave device with multi-period arccosine apodization (e.g., acoustic wave device 100), according to some embodiments of the present disclosure. FIG. 1C shows admittance/conductance of the acoustic wave as a function of frequency. Line 1 represents a SAW resonator without apodization, line 2 represents a SAW resonator with single-period arccosine apodization, and line 3 represents an exemplary acoustic wave device with multi-period arccosine apodization. In some embodiments, the number of periods in the acoustic wave device is at least 3, e.g., between about 3 and 50 per 100λ. As shown in FIG. 1C, while both SAW resonator with single-period arccosine apodization (2) acoustic wave device with multi-period arccosine apodization (3) can suppress transverse modes, and the acoustic wave device with multi-period arccosine apodization is less lossy than the acoustic wave device with single-period arccosine apodization especially below the resonance frequency. In FIG. 1C, below the resonance frequency, the conductance of (3) has periodic responses of longitudinal modes, but the conductance of (2) has much less responses of longitudinal modes that means the acoustic wave device with multi-period arccosine apodization has higher Q than the acoustic wave device with single period arccosine apodization.

The arccosine apodization curve/pattern employed for the first and second apodization edges (e.g., 116A and 116B) of this disclosure may be computed using a modified arccosine function:

$$y = \pm\left(L_{omin} + \left(\frac{\{\arccos(x)\}^b - \{\arccos(x_u)\}^b}{\{\arccos(x_l)\}^b - \{\arccos(x_u)\}^b} \times (1 - L_{omin})\right)\right),$$

where x represents the normalized position value from the peak in a period P in the x-direction, y represents the normalized amplitude of the arccosine function at the position value, $L_{omin}$ represents the dimension of minimum overlap 130 (or opening) in the y-direction, b represents the power coefficient of (arccos(x)), $x_l$ represents the lower limit of x, and $x_u$ represents the upper limit of x.

Figure 2A:
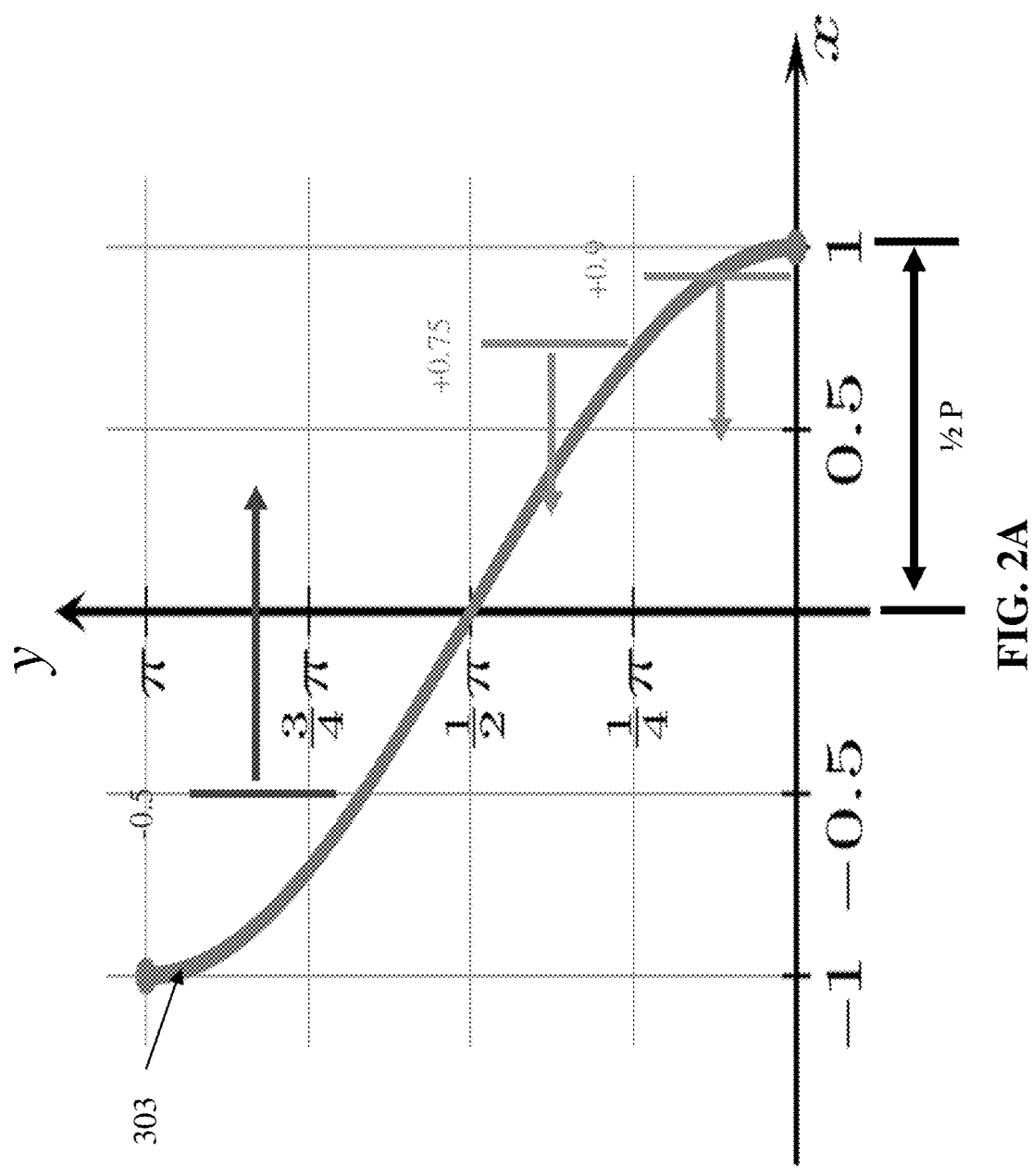
FIG. 2A illustrates a plot of y=arccos(x) in a certain range, according to some aspects of the present disclosure.

FIG. 2A illustrates the plot of an arccosine function 303 (e.g., a basic function) employed as an apodization edge, according to some embodiments. As shown in FIG. 2A, arccosine function 303 may be expressed as y=arccosine (x), and is plotted between $x_l$=−1 and $x_u$=1 as an example. In various embodiments, y may be plotted in any x range with the lower range limit less than the upper range limit. The plot of arccosine function 303 shows y varying as a function of arccosine(x). This basic function may be employed in the construction of the modified arccosine function as stated above (e.g., with b being 1). In some embodiments, arccosine function 303 in a certain range may be employed to construct the modified arccosine function. For example, the lower limit of x may be between about −0.5 and 0.5, and the upper limit of x may be between about 0.75 and about 1. For example, the lower limit of the normalized position value may be −0.5, −0.4, −0.2, 0, 0.2, 0.4, and 0.5, and the upper limit of the normalized position value may be about 0.75, 0.8, 0.9, and 1. In some embodiments, the part of arccosine function 303 in 0≤x≤1 may be used as a half period of an apodization edge in this disclosure.

Figure 2B:
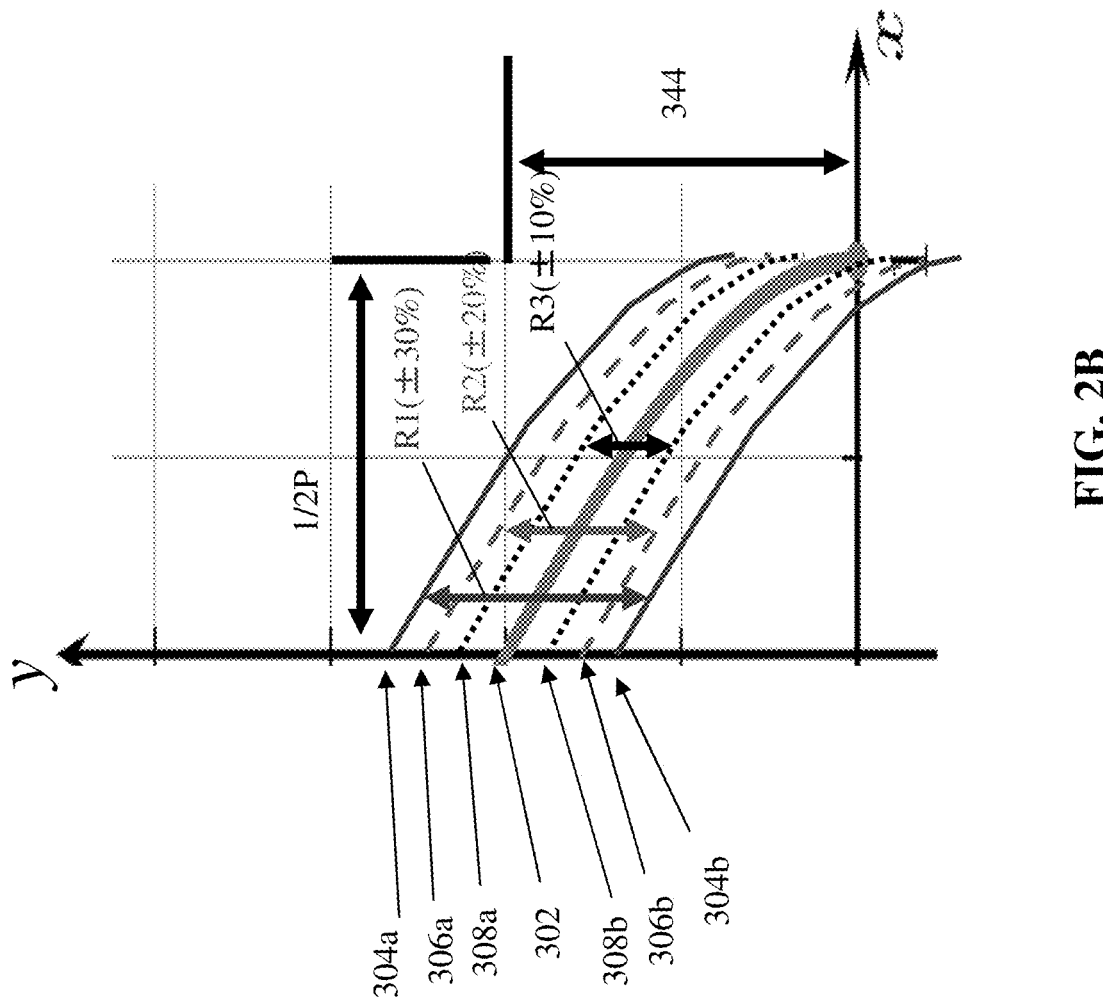
FIG. 2B illustrates a plot of an apodization edge used in the multi-period arccosine apodization in a half period, according to some aspects of the present disclosure.

FIG. 2B illustrates plots of a modified arccosine function, as well as upper and lower limits of an electrode finger or a dummy electrode in the y-direction, according to some embodiments. Curve 302 represent an example modified arccosine function $$y = \pm\left(L_{omin} + \left(\frac{\{\arccos(x)\}^b - \{\arccos(x_u)\}^b}{\{\arccos(x_l)\}^b - \{\arccos(x_u)\}^b} \times (1 - L_{omin})\right)\right)$$

between $x_l$=0 and $x_u$=1, and b=1. In some embodiments, when b is 1, y is also referred to as a regular arccosine function. In some embodiments, part of curve 302 at 0≤x≤1 represents the half period (½P) of an arccosine apodization curve (e.g., any disclosed apodization edge of this disclosure, such as 116A or 116B), where the arccosine apodization curve has its peak at x=0. As an example, the arccosine apodization curve may have an amplitude 344 which is amplitude Am when x is equal to 0. In some embodiments, curve 302 is mirrored about the y-direction to create the other half period. The full period may repeat in the x-direction to form the arccosine edges with multiple periods.

In various embodiments, the apodization edge or curve may not strictly follow a function. For example, for a x value (e.g., a position) on the x-direction, the corresponding function value (e.g., y value) may be a value located in a range from the value calculated from the apodization function. Accordingly, one or more electrode fingers (e.g., first electrode finger 110A and/or second electrode finger 110B) and/or one or more dummy electrodes (e.g., first dummy electrodes 118A and/or second dummy electrodes 118B) may not strictly follow the function that describes the apodization edge, and may deviate away from the respective function within a distance range. Accordingly, the length of the respective dummy electrode may vary such that the dimension of the gap (e.g., 146A and/or 146B) between the dummy electrode and the respective electrode finger may be unchanged.

For example, curve 302 may represent an apodization edge (e.g., 116A or 116B), which may be described $$y = \pm\left(L_{omin} + \left(\frac{\{arccos(x)\}^{b} - \{arccos(x_{u})\}^{b}}{\{arccos(x_{l})\}^{b} - \{arccos(x_{u})\}^{b}} \times (1 - L_{omin})\right)\right)$$

when $x_{1}=0$ and $x_{u}=1$, and b=1. Curve 302 may have an amplitude 344 of Am. Curve 304a may represent a first range boundary that is 30% Am higher than curve 302, and curve 304b may represent a second range boundary that is 30% Am lower than curve 302. For example, at the same x value, the y value of the apodization edge is between ±30% Am around curve 302, which is calculated from the equation above. In some embodiments, curve 302 represents apodization edge 116A, curve 304a represents an upper limit of first dummy electrode 118A, and curve 304b represents a lower limit of first electrode finger 110A. In some embodiments, curve 304a represents an upper limit of first electrode finger 110A, and curve 304b represents a lower limit of first dummy electrode 118A. In some embodiments, curve 302 represents apodization edge 116B, curve 304a may represent an upper limit of second electrode finger 110B, and curve 304b may represent a lower limit of second dummy electrode 118B. In some embodiments, curve 304a represents an upper limit of second dummy electrode 118B, and curve 304b represents a lower limit of second electrode finger 110B. In various embodiments, the dimension of the respective gap (e.g., 146A and/or 146B) may be nonzero (e.g., unchanged).

In various embodiments, the distance range may vary based on the design. For example, curve 306a may represent a first range boundary that is higher than curve 302 by 20% Am, and curve 306b may represent a second range boundary that is lower than curve 302 by 20% Am. Curves 306a and 306b form a range of +20% Am around curve 302. In another example, curve 306a may represent a first range boundary that is higher than curve 302 by 10% Am, and curve 306b may represent a second range boundary that is lower than curve 302 by 10% Am. Curves 308a and 308b form a range of ±10% Am around the apodization edge (e.g., curve 302). Similar to curves 304a and 304b, curves 306a and 306b and curves 308a and 308b may be employed as upper/lower limits of respective electrode fingers and dummy electrodes.

An arccosine apodization edge may follow an arccosine function over at least two adjacent electrode fingers (e.g., adjacent first electrode fingers or adjacent second electrode fingers). In some embodiments, of the at least two adjacent electrode fingers, the arccosine apodization edge may strictly/exactly follow an arccosine function over one of the at least two adjacent electrode fingers; and a distance between another one of the at least two adjacent electrode fingers and the respective periodic arccosine apodization function is within the predetermined percentage (e.g., 10%, 20%, or 30%) of the apodization amplitude.

Figure 2C:
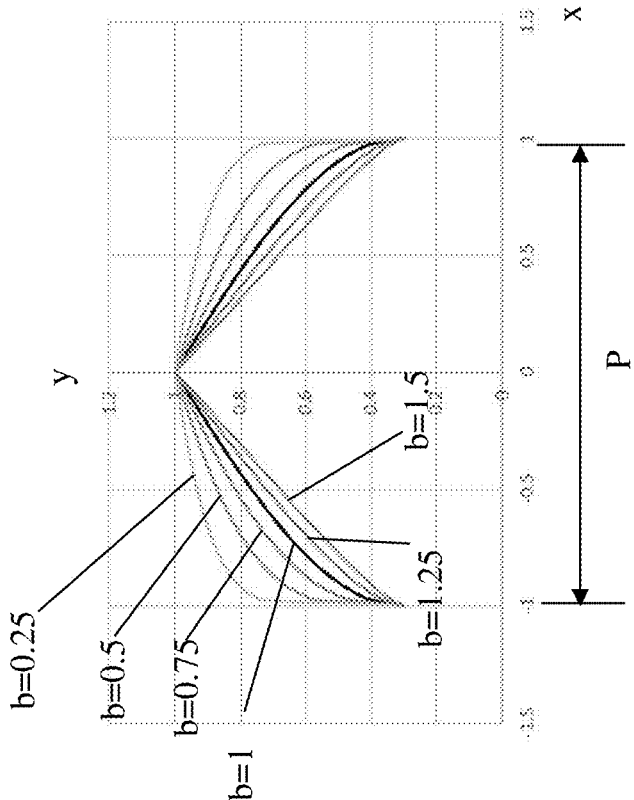
FIG. 2C illustrates a plot of an apodization edge used in the multi-period arccosine apodization in a period, according to some aspects of the present disclosure.

FIG. 2C represents plots of various example arccosine apodization curves with varying b values in one of the multiple periods, generated base on the modified arccosine function $$y = \pm\left(L_{omin} + \left(\frac{\{arccos(x)\}^{b} - \{arccos(x_{u})\}^{b}}{\{arccos(x_{l})\}^{b} - \{arccos(x_{u})\}^{b}} \times (1 - L_{omin})\right)\right).$$

The peak of the period may be set as position "0" in the x-direction. For ease of illustration, period P, shown in FIG. 2, may have a length of 2 with a lower limit being −1 and the upper limit being 1. In some embodiments, the lower limit ($x_{1}$) of the normalized position value may be between about −0.5 and 0.5, and the upper limit ($x_{u}$) of the normalized position value may be between about 0.75 and about 1. For example, the lower limit of the normalized position value may be −0.5, −0.4, −0.2, 0, 0.2, 0.4, and 0.5, and the upper limit of the normalized position value may be about 0.75, 0.8, 0.9, and 1. As shown in FIG. 2C, when b changes, the shape of the arccosine apodization curve can change accordingly. In various embodiments, b may be between about 0.5 and about 1.5. For example, b may be 0.5, 0.6, 0.75, 0.9, 1, 1.2, 1.35, and 1.5. In some embodiments, b may be between about 0.7 and about 1.25. In various embodiments, the full period with different shapes (i.e., b value) may repeat in the x-direction to form the arccosine edges with multiple periods to form different arccosine apodization edges.

Figure 3A:
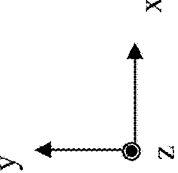
FIG. 3A illustrates acoustic wave devices with multi-period arccosine apodization having different numbers of periods, according to some aspects of the present disclosure.

FIG. 3A illustrates acoustic wave devices having apodization edges with different number of periods in the x-direction, according to some embodiments. As described above, an apodization edge may follow a modified arccosine function as stated above, and may have a plurality of periods in the x-direction. FIG. 3A illustrates acoustic wave devices 300a, 300b, 300c, 300d, 300c, and 300f. Each of the acoustic wave device may include a first busbar 104A and a second busbar 104B, a plurality of first electrode fingers extending from first busbar 104A and a plurality of second electrode fingers extending from second busbar 104B. The interdigital electrode structure 302 of each acoustic wave device is apodized by a pair of apodization edges. For example, each of these acoustic wave devices is apodized by a first apodization edge 316A and a second apodization edge 316B. In some embodiments, first apodization edge 316A and second apodization edge 316B are symmetric about a middle line 340 of the respective interdigital electrode structure. Detailed description of each acoustic wave device may be referred to that of acoustic wave device 100, and is not repeated herein.

Figure 3B:
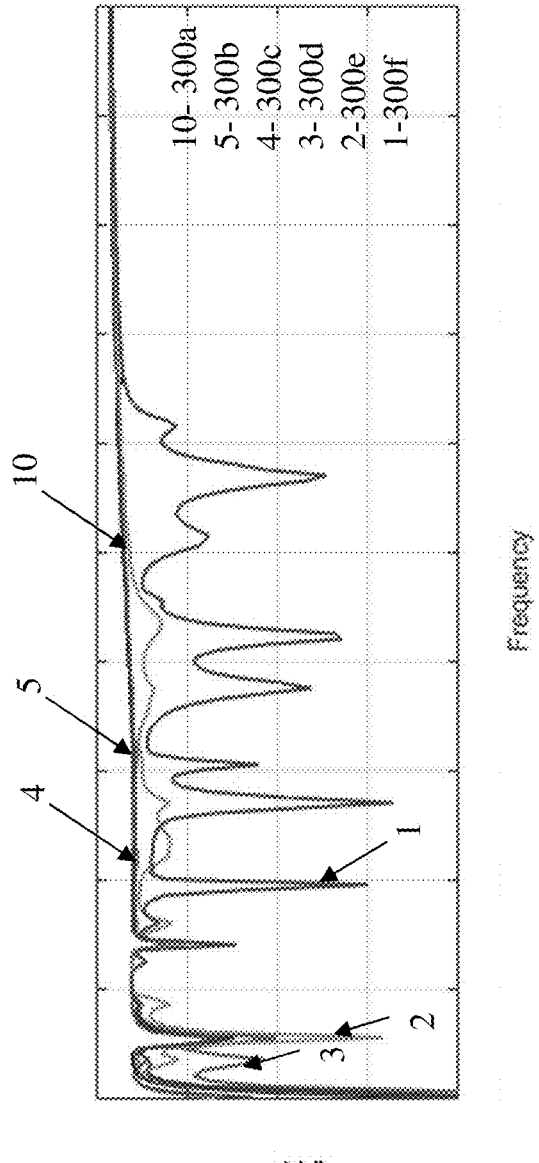
FIGS. 3B and 3C illustrate comparisons of acoustic wave devices with multi-period arccosine apodization having different numbers of periods, according to some aspects of the present disclosure.
Figure 3C:
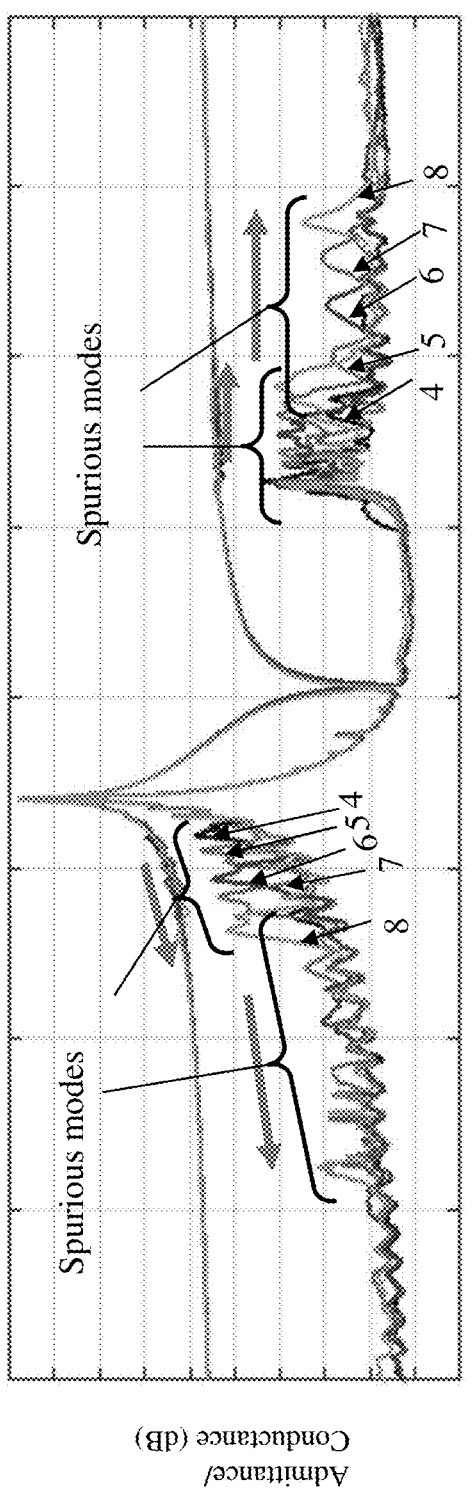

The apodization edges in each of the acoustic wave device may have a different number of period, each denoted as "1P". As shown in FIG. 3A, in a distance of 100λ (e.g., equivalent of 200 electrode fingers in total) in the x-direction, acoustic wave device 300a may have 10 periods, acoustic wave device 300b may have 5 periods, acoustic wave device 300c may have 4 periods, acoustic wave device 300d may have 3 periods, acoustic wave device 300e may have 2 periods, and acoustic wave device 300f may have 1 period. In each acoustic wave device, the periods are identical. FIG. 3B illustrates a comparison of suppression of transverse modes S11 (of one port resonator) by different acoustic wave devices. As shown in FIG. 3B, transverse modes are suppressed when the number of periods is at least 3. For example, when the number of periods is 4, 5, or 10, transverse modes may be suppressed. FIG. 3C illustrates a comparison of suppression of spurious modes by different acoustic wave devices. As shown in FIG. 3C, transverse modes are suppressed when the number of periods is at least 3. For example, when the number of periods is 4, 5, 6, 7, or 8, spurious modes may be suppressed.

Figure 4A:
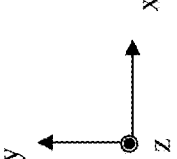
FIGS. 4A-4C illustrate other exemplary acoustic wave devices with multi-period arccosine apodization, according to some aspects of the present disclosure.
Figure 4B:
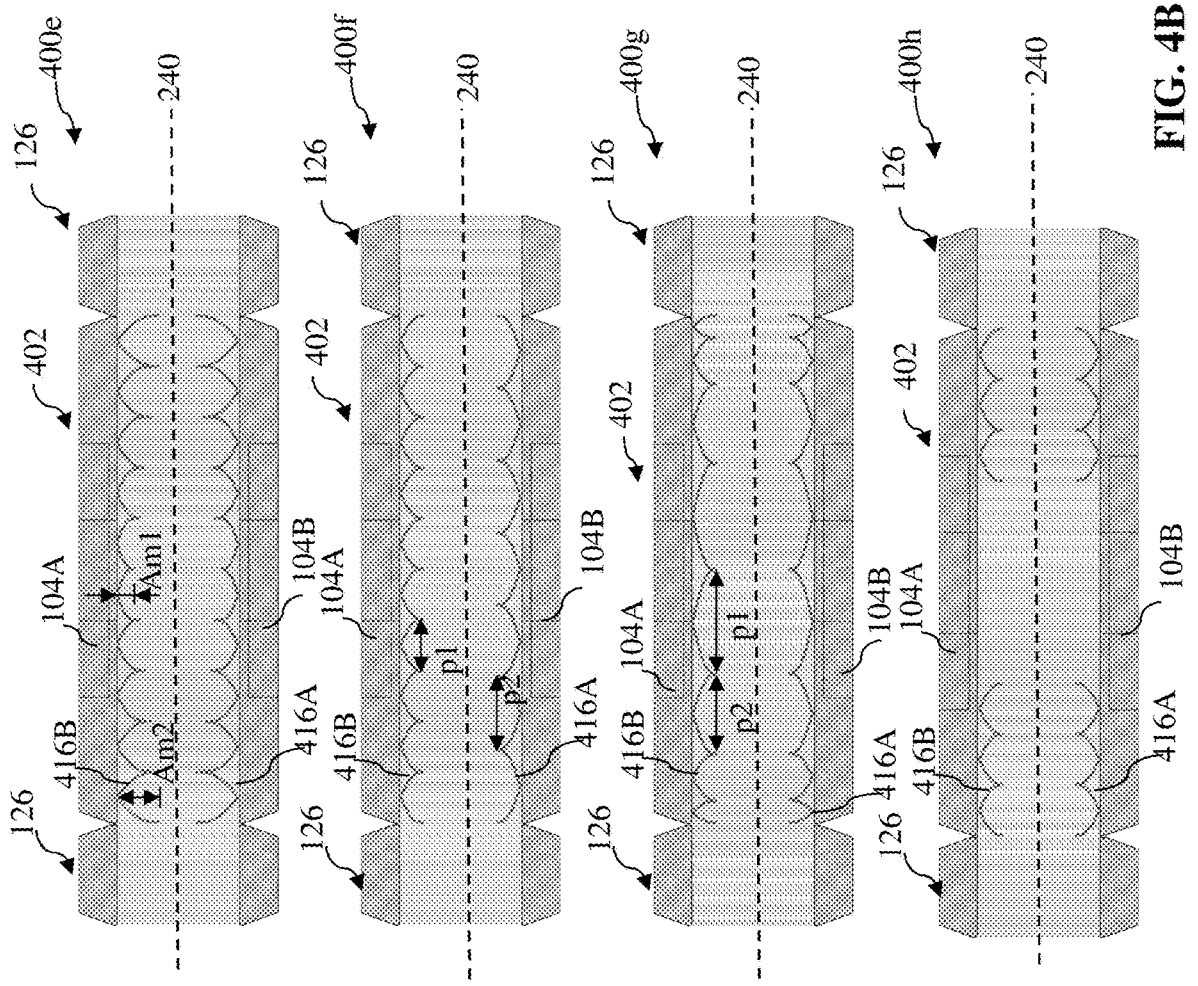
Figure 4B:
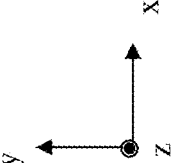
Figure 4C:
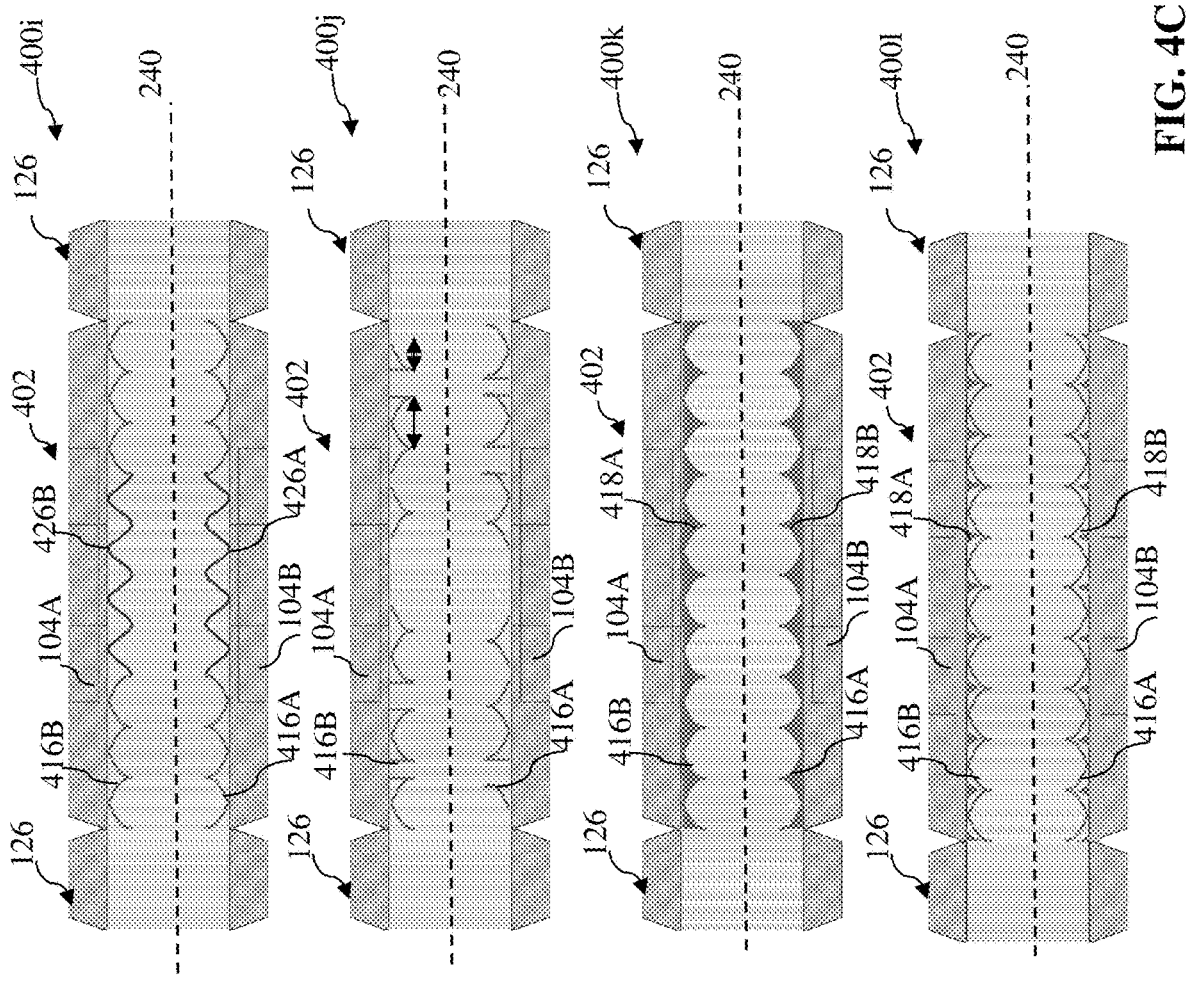
Figure 4C:
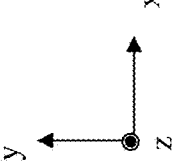

FIGS. 4A-4C illustrate different acoustic wave devices 400a-4001, each having a different configuration of apodization edges, according to some embodiments. Each of the acoustic wave devices may include a piezoelectric layer (not shown), and an interdigital electrode structure 402 and a pair of reflectors 126. Interdigital electrode structure 402 may be between the reflectors 126. Each of the acoustic wave devices may be apodized with a first apodization edge 416A and a second apodization edge 416B. First apodization edge 416A and second apodization edge 416B may each be created based on the modified arccosine function $$ y = \pm \left( L_{omin} + \left( \frac{\{arccos(x)\}^b - \{arccos(x_u)\}^b}{\{arccos(x_l)\}^b - \{arccos(x_u)\}^b} \times (1 - L_{omin}) \right) \right), $$

using chosen parameters such as b values. Each of the acoustic wave device may include a first busbar 104A and a second busbar 104B, a plurality of first electrode fingers extending from first busbar 104A and a plurality of second electrode fingers extending from second busbar 104B. Detailed description of the acoustic wave device may be referred to that of acoustic wave device 100, and is not repeated herein.

As shown in FIG. 4A, acoustic wave device 400a has a "narrow end" configuration. First apodization edge 416A and second apodization edge 416B may be symmetric about middle line 240. Each period may have a same length in the x-direction. First apodization edge 416A and second apodization edge 416B may have the same amplitudes in the y-direction. At a boundary of interdigital electrode structure 402, an end 408A of first apodization edge 416A and an end 408B of second apodization edge 416B may aligned with each other in the y-direction. A distance h between end 408A and end 408B may be less than a distance H between first busbar 104A and second busbar 104B.

Acoustic wave device 400b has a "wide end" configuration. First apodization edge 416A and second apodization edge 416B may be symmetric about middle line 240. Each period may have a same length in the x-direction. First apodization edge 416A and second apodization edge 416B may have the same amplitudes in the y-direction. At a boundary of interdigital electrode structure 402, distance h between end 408A and end 408B may be the same as distance H between first busbar 104A and second busbar 104B.

Acoustic wave device 400c has an "asymmetric" configuration. Each period may have a same length in the x-direction. First apodization edge 416A and second apodization edge 416B may have the same amplitudes in the y-direction. First apodization edge 416A and second apodization edge 416B may not be symmetric about middle line 240. For example, a period of first apodization edge 416A and a period of second apodization edge 416B may have an offset $L_{off}$ in the x-direction. For example, $L_{off}$ may be the distance between adjacent peaks of first apodization edge 416A and second apodization edge 416B. In some embodiments, $L_{off}$ is less than one period. For example, $L_{off}$ may be a half period.

Acoustic wave device 400d has a "different amplitude" configuration. First apodization edge 416A and second apodization edge 416B may not be symmetric about middle line 240. Each period may have a same length in the x-direction. First apodization edge 416A and second apodization edge 416B may have different amplitudes in the y-direction. For example, apodization edge 416A may have a wave length of Am1, and apodization edge 416B may have a wavelength of Am2, Am1 being different from Am2.

As shown in FIG. 4B, acoustic wave device 400e has an "different amplitudes in x-direction" configuration. Each period may have a same length in the x-direction. First apodization edge 416A and second apodization edge 416B may each have varying amplitudes in the x-direction. First apodization edge 416A and second apodization edge 416B may be symmetric about middle line 240. For example, first apodization edge 416A (or second apodization edge 416B may have a first amplitude Am1 for one period, and have another amplitude Am2 for another period, Am1 being different from Am2. The two periods may be adjacent to each other or may be separated by one or more periods. In some embodiments, first apodization edge 416A (or second apodization edge 416B) may have smaller amplitude(s) in the center of interdigital electrode structure 402, and the amplitude(s) may increase towards the boundaries.

Acoustic wave device 400f has an "different number of periods" configuration. Each period of the respective apodization edge may have a same length in the x-direction, and each apodization edge may include a different number of periods. First apodization edge 416A and second apodization edge 416B may have a different number of periods in the x-direction, and may not be symmetric about middle line 240. For example, the period of first apodization edge 416A may have a length of p1, and the period of second apodization edge 416B may have a length of p2, p1 being different from p2.

Acoustic wave device 400g has an "different periods in x-direction" configuration. One or more periods of the same apodization edge may different lengths in the x-direction. First apodization edge 416A and second apodization edge 416B may each have varying period lengths in the x-direction. First apodization edge 416A and second apodization edge 416B may be symmetric about middle line 240. For example, first apodization edge 416A (or second apodization edge 416B may have a first length p1 for one period, and have another length p2 for another period, p1 being different from p2. The two periods may be adjacent to each other or may be separated by one or more periods. In some embodiments, a period of first apodization edge 416A (or second apodization edge 416B) may have longer length in the center of interdigital electrode structure 402, and the length may increase towards the boundaries.

Acoustic wave device 400h has a "partial apodization" configuration. First apodization edge 416A and second apodization edge 416B may be symmetric about middle line 240. Each period may have a same length in the x-direction. First apodization edge 416A and second apodization edge 416B may have the same amplitudes in the y-direction. Each of first apodization edge 416A and second apodization edge 416B may apodize part of the electrode fingers, with the rest of the electrode fingers unapodized. For example, first apodization edge 416A (or second apodization edge 416B) may each extend in part of interdigital electrode structure 402 in the x-direction, and may not extend in the rest of the interdigital electrode structure 402. As an example, each of first apodization edge 416A and second apodization edge 416B may include two portions, respectively distributed on the two sides of interdigital electrode structure 402, leaving the center portion of the interdigital electrode structure 402 unapodized. Each portion may include at least two periods.

As shown in FIG. 4C, acoustic wave device 400i has a "partially different apodization" configuration. Different from acoustic wave device 400h, acoustic wave device 400i is also apodized with apodization edges different from first apodization edge 416A and second apodization edge 416B. For example, interdigital electrode structure 402 may be apodized with a first non-arccosine apodization edge 426A between the two portions of first apodization edge 416A, and a second non-arccosine apodization edge 426B between the two portions of second apodization edge 416B. First non-arccosine apodization edge 426A and second non-arccosine apodization edge 426B may be symmetric about middle line 240, and may each be connected to the respective apodization edge. In some embodiments, the non-arccosine apodization edges 426A and 426B each includes a sinusoid curve of one or more periods.

Acoustic wave device 400j has a "intermittent apodization" configuration. First apodization edge 416A and second apodization edge 416B may not be symmetric about middle line 240. First apodization edge 416A and second apodization edge 416B may each have one or more half periods and/or one or more periods. The half periods and periods may be connected or disconnected, depending on the design. Each period may have a same length in the x-direction. First apodization edge 416A and second apodization edge 416B may have the same amplitudes in the y-direction.

Acoustic wave device 400k has a "metalized dummy area" configuration. First apodization edge 416A and second apodization edge 416B may be symmetric about middle line 240. Each period may have a same length in the x-direction. First apodization edge 416A and second apodization edge 416B may have the same amplitudes in the y-direction. Different from acoustic wave device 400a, the dummy electrodes extending from the same busbar are connected with metal. For example, a first dummy electrode (extending from second busbar 104B) and an adjacent second electrode finger may be metalized to form a metal film 418B. In some embodiments, adjacent first dummy electrodes and the second electrode finger in between may be metalized to form a metal film 418B. The metal film 418B may not exceed the gaps between the first dummy electrodes and their respective first electrode fingers. Similarly, a second dummy electrode (extending from first busbar 104A) and an adjacent first electrode finger may be metalized to form a metal film 418A. In some embodiments, adjacent second dummy electrodes and the first electrode finger in between may be metalized to form a metal film 418A. The metal film 418B may not exceed the gaps between the second dummy electrodes and their respective second electrode fingers. In some embodiments, all the dummy electrodes extending from the same busbar are metalized together to form a metalized dummy area.

Acoustic wave device 400l has a "partially metalized dummy area" configuration. First apodization edge 416A and second apodization edge 416B may be symmetric about middle line 240. Each period may have a same length in the x-direction. First apodization edge 416A and second apodization edge 416B may have the same amplitudes in the y-direction. Different from acoustic wave device 400k, the dummy electrodes extending from the same busbar are partially metalized (418A and 418B). For example, one or more dummy electrodes at a valley of the respective apodization edge 416A/416B are metalized with an adjacent electrode finger. In some embodiments, one or more dummy electrodes at all valleys of the apodization edges 416A and 416B are metallized with an adjacent electrode finger, while dummy electrodes away from the valleys are separated from each other (and any electrode fingers).

Figure 5:
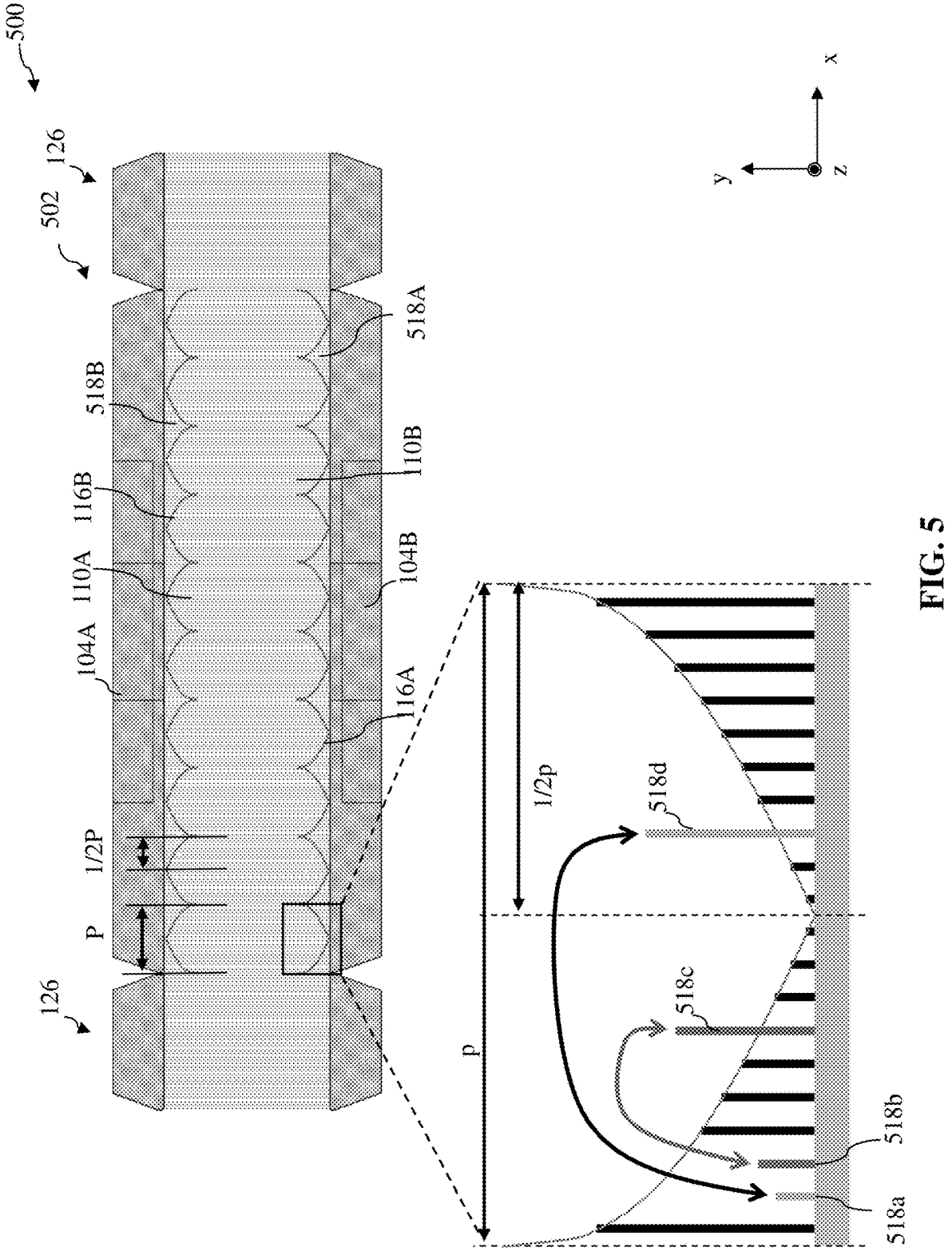
FIG. 5 illustrates another exemplary acoustic wave devices with multi-period arccosine apodization, according to some aspects of the present disclosure.

FIG. 5 illustrates a configuration of dummy electrodes in an acoustic wave device 500 with multi-period arccosine apodization, according to some embodiments. Similar to acoustic wave device 100, acoustic wave device 500 includes an interdigital electrode structure 502 and a pair of reflectors 126. Interdigital electrode structure 502 may include first busbar 104A and second busbar 104B, a plurality of first electrode fingers 110A and a plurality of second electrode fingers 110B, and a plurality of first dummy electrodes 518A and a plurality of second dummy electrodes 518B. First electrode fingers 110A and second electrode fingers 110B may be apodized with first apodization edge 116A and second apodization edge 116B, respectively. First dummy electrodes 518A may extend from second busbar 104B towards first apodization edge 116A, and second dummy electrodes 518B may extend from first busbar 104A towards second apodization edge 116B.

Different from acoustic wave device 100, a first dummy electrode at a first position of a busbar may be swapped with a second dummy electrode at a second position of the same busbar. The first and second dummy electrodes may have different lengths in the y-direction. In various embodiments, the first and second dummy electrodes may be in the same period, in the same half period, or in different periods. In such configuration, the length of the electrode fingers aligned with the dummy electrodes (e.g., in the y-direction) may be adjusted accordingly to maintain a gap between the respective electrode and the dummy electrode. For example, as shown in FIG. 5, first dummy electrode 518a may be swapped with first dummy electrode 518d in the same period (but different half periods), and/or first dummy electrode 518b may be swapped with first dummy electrode 518c in the same half period. Accordingly, the first electrode fingers aligned with the first dummy electrodes (e.g., 518a, 518b, and 518c) are also swapped such that the gap between a first dummy electrode and the respective first electrode finger stays unchanged. In another example, first dummy electrodes 518c may be in a different period than first dummy electrode 518b, and/or first dummy electrodes 518a may be in a different period than first dummy electrode 518d. The dummy electrode may or may not exceed the range defined about the respective apodization edge, as described in FIG. 2B. In various embodiments, the number of dummy electrodes in the swap can vary and is not limited to the embodiments of the present disclosure. The second dummy electrodes and respective second electrode fingers can be swapped in a similar way, and the detailed description is not repeated herein.

Figure 6B:
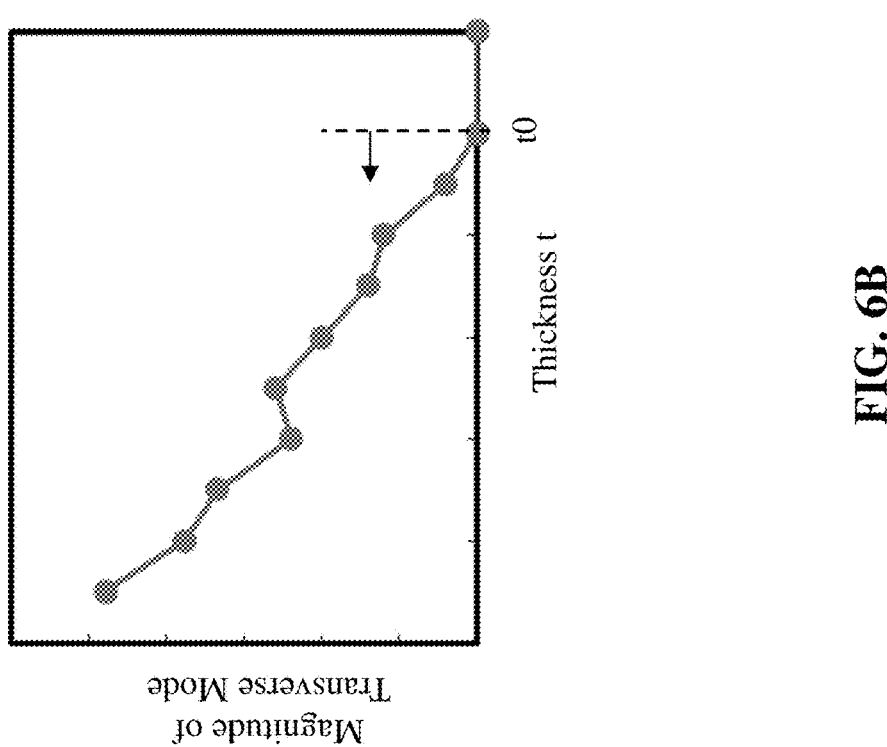
FIGS. 6A and 6B illustrate an exemplary bonded wafer structure employing a acoustic wave device with multi-period arccosine apodization, according to some aspects of the present disclosure.
Figure 6A:
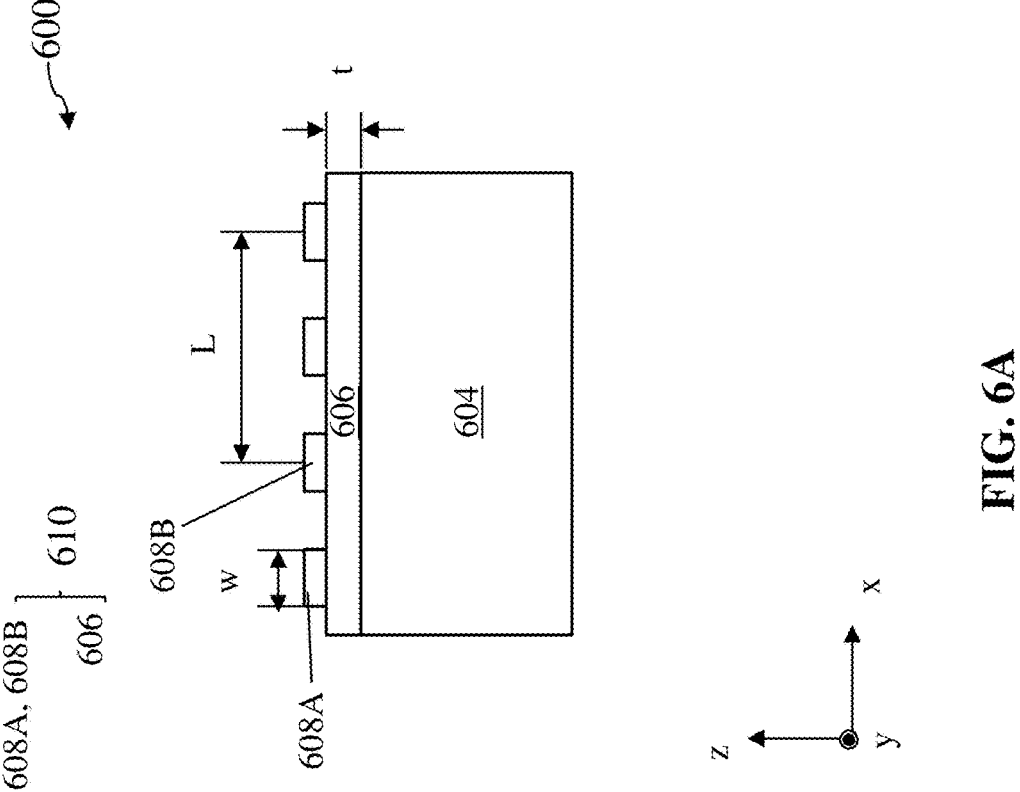

The disclosed acoustic wave device with multi-period arccosine apodization may be employed in various applications. FIG. 6A illustrates a bonded wafer structure 600 with an acoustic wave device 610 with multi-period arccosine apodization. In some embodiments, a piezoelectric layer 606 includes lithium tantalate (LiTaO) and/or lithium niobate (LiNbO). In some embodiments, substrate 604 includes at least one of silicon, sapphire, quartz, silicon carbide, spinel, ceramics, and/or other insulation/semiconductor materials. A thickness t of piezoelectric layer 606 (e.g., in the z-direction) may be less than t0. As shown in FIG. 6B, when thickness t is less than a threshold thickness value t0 (e.g., typically about 5λ), transverse modes may be observed in the acoustic wave. To reduce the transverse modes, the disclosed acoustic wave device, e.g., acoustic wave device 610, may be applied on substrate 604. In some embodiments, piezoelectric layer 606 is a piezoelectric substrate, and no additional substrate is needed. The piezoelectric substrate, including a piezoelectric layer, may have sufficient thickness to support the manufacturing and functioning of acoustic wave device 610. For example, the piezoelectric substrate may be a piezoelectric wafer. In some embodiments, piezoelectric layer 606 is a piezoelectric membrane with the thickness less than one or more wavelength(s) λ of the acoustic wave. In some embodiments, no additional substrate is formed under piezoelectric membrane.

Acoustic wave device 610 may be any one of the acoustic wave devices of this disclosure (e.g., acoustic wave devices 100, 101, 400a-4001, etc.). Acoustic wave device 610 may include a substrate 604 and a piezoelectric layer 606 disposed on substrate 604. Acoustic wave device 610 may also include a plurality of first electrode fingers 608A and a plurality of second electrode fingers 608B interweavingly disposed on piezoelectric layer 606. A width w of a first electrode finger 608A (or second electrode finger 608B) may be about 0.25λ, λ being the wavelength of the acoustic wave propagating in the electrode fingers. A distance L between adjacent first electrode fingers 608A or between adjacent second electrode fingers 608B may be about λ.

Figure 7:
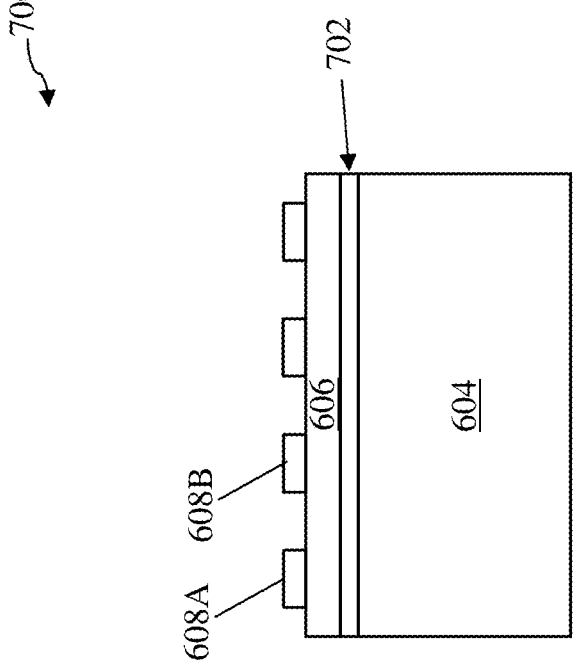
FIG. 7 illustrates another exemplary bonded wafer structure employing a acoustic wave device with multi-period arccosine apodization, according to some aspects of the present disclosure.
Figure 7:
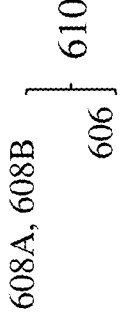
Figure 7:
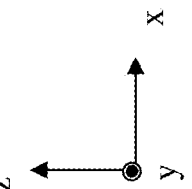

FIG. 7 illustrates a bonded wafer structure 700 with an acoustic wave device 610 with multi-period arccosine apodization. Different from bonded wafer structure 600, bonded wafer structure 700 includes an intermediate layer 702 between piezoelectric layer 606 and substrate 604. Intermediate layer 702 may include a material that has a positive temperature coefficient of velocity, and can thus compensate the velocity change of the acoustic wave by other layers/materials (e.g., which typically have a negative temperature coefficient of velocity). In some embodiments, intermediate layer 702 includes silicon oxide (SiO) and/or tantalum oxide ($Ta_xO_y$), such as $SiO_2$ and/or $Ta_2O_5$.

FIG. 8 illustrates a coupled resonator filter 800 with a plurality of acoustic wave devices with multi-period arccosine apodization. As shown in FIG. 8, a coupled resonator filter 800 may include acoustic wave devices 802, 804, 806, 808, and 810 (e.g., interdigital transducers) arranged in the x-direction to provide a desired filter response. Adjacent acoustic wave devices may be forwardly biased or reversely biased. As an example, FIG. 8 shows adjacent acoustic wave devices are reversely biased. Each of acoustic wave devices 802-810 may be any of the acoustic wave devices of this disclosure (e.g., acoustic wave devices 100, 101, 400a-4001, etc.). For example, each of the acoustic wave devices 802-810 has the same apodization edges. As shown in FIG. 8, acoustic wave devices 802-810 may be coupled between an input node IN, an output node OUT, and ground. Acoustic wave devices 802-810 may be arranged to be adjacent to one another, and the first apodization edges and the second apodization edges may be respectively connected/aligned together to form a first apodization edge 816A and a second apodization edge 816B. In various embodiments, first apodization edge 816A and second apodization edge 816B may or may not be continuous along the x-direction. A pair of reflectors 806 are provided respectively adjacent to acoustic wave device 802 and acoustic wave device 810.

Those skilled in the art will recognize improvements and modifications to the preferred embodiments of the present disclosure. All such improvements and modifications are considered within the scope of the concepts disclosed herein and the claims that follow.

What is claimed is:

1. An acoustic wave device, comprising:

a piezoelectric layer; and an interdigital electrode structure over the piezoelectric layer, the interdigital electrode structure comprising, in a width direction, a plurality of first electrode fingers extending from a first busbar towards a first apodization edge, and a plurality of second electrode fingers extending from a second busbar towards a second apodization edge, the plurality of first electrode fingers and the plurality of second electrode fingers interleaved with one another along a length direction, the length direction being different from the width direction, wherein at least one of the first apodization edge or the second apodization edge follows a periodic arccosine apodization function over at least two adjacent electrode fingers of the plurality of first electrode fingers or the plurality of second electrode fingers, a number of periods of the at least one of the first apodization edge or the second apodization edge being at least 2; and a first distance between one of a first electrode finger or a second electrode finger and the respective periodic arccosine apodization function is less than or equal to a predetermined percentage between zero and 100% of an apodization amplitude of the periodic arccosine apodization function.

2. The acoustic wave device of claim 1, wherein the interdigital electrode structure further comprises a plurality of first dummy electrodes extending from the second busbar and a plurality of second dummy electrodes extending from the first busbar, the plurality of first dummy electrodes each aligned with a respective first electrode finger in the width direction and separated from the respective first electrode finger by a first gap, the plurality of second dummy electrodes each aligned with a respective second electrode finger in the width direction and separated from the respective second electrode finger by a second gap.

3. The acoustic wave device of claim 2, wherein a second distance between one of a first dummy electrode or a second dummy electrode and the respective periodic arccosine apodization function is less than or equal to a second predetermined percentage between zero and 100% of the apodization amplitude of the periodic arccosine apodization function.

4. The acoustic wave device of claim 3, wherein the first percentage and the second percentage are each equal to about 30%.

5. The acoustic wave device of claim 2, wherein a minimum length of at least one of the plurality of first dummy electrodes or the plurality of second dummy electrodes is between 0 and about 5λ, λ being a wavelength of an acoustic wave propagating in the interdigital electrode structure.

6. The acoustic wave device of claim 2, wherein:

at least one of the plurality of first dummy electrodes has an edge that does not align with the periodic arccosine apodization function, and at least one first electrode finger aligned with the at least one of the plurality of first dummy electrodes does not align with the periodic arccosine apodization function; or at least one of the plurality of second dummy electrodes has an edge that does not align with the periodic arccosine apodization function, and at least one second electrode finger aligned with the at least one of the plurality of second dummy electrodes does not align with the periodic arccosine apodization function.

7. The acoustic wave device of claim 2, wherein:

a first dummy electrode of the plurality of first dummy electrodes and an adjacent second electrode finger of the plurality of second electrode fingers are joined by a metal film; or a second dummy electrode of the plurality of second dummy electrodes and an adjacent first electrode finger of the plurality of first electrode fingers are joined by another metal film.

8. The acoustic wave device of claim 1, wherein in one period, a normalized value of the periodic arccosine apodization function at a position in the length direction is partially determined by a position value, the position value being between about −0.5 and about 1.

9. The acoustic wave device of claim 8, wherein in the one period, the normalized value of the periodic arccosine apodization function at the position is further partially determined by a power coefficient associated with the position value, the power coefficient being between about 0.5 and 1.5.

10. The acoustic wave device of claim 1, wherein the number of periods of the at least one of the first apodization edge or the second apodization edge is between about 3 per $100\lambda$ and about 50 per $100\lambda$, $\lambda$ being a wavelength of an acoustic wave propagating in the interdigital electrode structure.

11. The acoustic wave device of claim 1, wherein in one period, a minimum overlap between adjacent first electrode finger and second electrode finger is greater than zero.

12. The acoustic wave device of claim 11, wherein in one period, the minimum overlap between adjacent first electrode finger and second electrode finger is equal to or greater than a percentage of a maximum overlap between adjacent first electrode finger and second electrode finger.

13. The acoustic wave device of claim 12, wherein the percentage is about 5%.

14. The acoustic wave device of claim 1, wherein the apodization amplitude is greater than or equal to about $\lambda$ and less than or equal to about $8\lambda$, $\lambda$ being a wavelength of an acoustic wave propagating in the interdigital electrode structure.

15. The acoustic wave device of claim 1, wherein the at least one of the first apodization edge or the second apodization edge comprises a first period and a second period in the length direction, the first and second periods being the same or different.

16. The acoustic wave device of claim 1, further comprising a substrate bonded with the piezoelectric layer, wherein a thickness of the piezoelectric layer is less than or equal to $5\lambda$, $\lambda$ being a wavelength of an acoustic wave transmitted in the interdigital electrode structure.

17. The acoustic wave device of claim 16, further comprising an intermediate layer between the piezoelectric layer and the substrate, the intermediate layer comprising silicon oxide (SiO) or tantalum oxide ($Ta_xO_y$), a metallic material, an insulating material, or a semiconductor material.

18. The acoustic wave device of claim 16, wherein:

the piezoelectric layer comprises lithium tantalate (LiTaO) or lithium niobate (LiNbO); and the substrate comprises at least one of silicon, sapphire, quartz, silicon carbide, spinel, ceramics, an insulating material, or a semiconductor material.

19. The acoustic wave device of claim 1, wherein the first apodization edge and the second apodization edge have a same apodization amplitude or different apodization amplitudes.

20. A coupled resonator filter, comprising a plurality of acoustic resonators arranged in a length direction, wherein each of the acoustic resonators comprises:

a piezoelectric layer; and a plurality of interdigital electrode structures over the piezoelectric layer, wherein each of the plurality of interdigital electrode structures comprises:

in a width direction, a plurality of first electrode fingers extending from a first busbar towards a first apodization edge, and a plurality of second electrode fingers extending from a second busbar towards a second apodization edge, the plurality of first electrode fingers and the plurality of second electrode fingers interleaved with one another along a length direction, the length direction being different from the width direction, wherein:

at least one of the first apodization edge or the second apodization edge follows a periodic arccosine apodization function over at least two adjacent electrode fingers of the plurality of first electrode fingers or the plurality of second electrode fingers, a number of periods of the at least one of the first apodization edge or the second apodization edge being at least 2; and a first distance between one of a first electrode finger or a second electrode finger and the respective periodic arccosine apodization function is less than or equal to a predetermined percentage between zero and 100% of an apodization amplitude of the periodic arccosine apodization function.

* * * * *